US 6,548,389 B2

(12) United States Patent
Moriwaki et al.

(10) Patent No.: US 6,548,389 B2
(45) Date of Patent: Apr. 15, 2003

(54) SEMICONDUCTOR DEVICE AND METHOD FOR FABRICATING THE SAME

(75) Inventors: Masaru Moriwaki, Osaka (JP); Takayuki Yamada, Osaka (JP); Kazuhiko Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/759,451

(22) Filed: Jan. 16, 2001

(65) Prior Publication Data

US 2001/0025972 A1 Oct. 4, 2001

(30) Foreign Application Priority Data

Apr. 3, 2000 (JP) ........................................ 2000-100306

(51) Int. Cl.[7] ................. H01L 21/3205; H01L 21/4763; H01L 21/44
(52) U.S. Cl. ....................... 438/592; 438/597; 438/627; 438/655
(58) Field of Search ................. 438/592, 597, 438/627, 629, 651, 655, 685

(56) References Cited

U.S. PATENT DOCUMENTS 6,015,990 A * 1/2000 Hieda et al. ................. 257/310
6,091,120 A * 7/2000 Yeom et al. ................. 257/401
6,100,193 A * 8/2000 Suehiro et al. ............. 438/685
6,107,200 A * 8/2000 Takagi et al. ............... 438/685
6,204,518 B1 * 3/2001 Adan et al. .................. 257/67
6,204,540 B1 * 3/2001 Otsuki ......................... 257/390
6,277,729 B1 * 8/2001 Wu et al. .................... 438/627
6,284,636 B1 * 9/2001 Hossain et al. ............. 438/592

FOREIGN PATENT DOCUMENTS

JP        07-221048        8/1995

OTHER PUBLICATIONS

H. Yang et al., "A Comparison of TiN Processes for CVD W/TiN Gate Electrode on 3nm Gate Oxide", IEDM Tech. Dig., pp. 459–462, Jul. 1997.

* cited by examiner

Primary Examiner—John F. Niebling
Assistant Examiner—Walter L. Lindsay, Jr.
(74) Attorney, Agent, or Firm—Nixon Peabody LLP; Donald R. Studebaker

(57) ABSTRACT

After an insulating film serving as a gate insulating film is formed on a semiconductor substrate, a titanium nitride film is deposited by chemical vapor deposition on the insulating film. Then, a tungsten film is deposited by sputtering on the titanium nitride film. Subsequently, a multilayer film composed of the tungsten film and the titanium nitride film is patterned to form a gate electrode composed of the multilayer film.

14 Claims, 12 Drawing Sheets

|  | RESIDUAL CHLORINE CONCENTRATION (at%) | GATE LEAKAGE CURRENT (A/cm²) |
|---|---|---|
| DEPOSITED AT 650°C | 1.77 | $1.44 \times 10^{-6}$ |
| DEPOSITED AT 490°C | 4.16 | $1.79 \times 10^{-4}$ |

SEMICONDUCTOR DEVICE AND METHOD FOR FABRICATING THE SAME

BACKGROUND OF THE INVENTION

The present invention relates to a semiconductor device having a gate electrode composed of a multilayer film comprising a lower-layer titanium nitride film and an upper-layer tungsten film and a method for fabricating the same.

With the recent advancement of technology for providing a higher-speed semiconductor integrated circuit with a higher integration density, a MOSFET has been miniaturized increasingly.

However, if a gate insulating film for a conventional gate electrode composed of a polycrystalline silicon film is thinned more and more with the miniaturization of the MOSFET, the driving force of the MOSFET lowers markedly due to the depletion of the gate electrode.

To circumvent the problem, attention has been focused recently on a metal gate process which uses, as a gate electrode, a metal film free from the depletion of the gate electrode. The metal gate process is effective in reducing a delay in the gate electrode since a materiel composing the gate electrode of the metal gate has a low resistance value.

As one of structures of the gate electrode, there has been used a multilayer structure comprised of a lower-layer titanium nitride film (TiN) film having a thickness of about 10 to 20 nm and an upper-layer tungsten (W) film having a thickness of about 50 to 100 nm.

As conventional methods for forming a multilayer film comprising a lower-layer titanium nitride film and an upper-layer tungsten film, there have been known a first method wherein a tungsten film is deposited by CVD using $WF_6$ gas on a titanium nitride film deposited by sputtering, a second method wherein a tungsten film is deposited by sputtering on a titanium nitride film also deposited by sputtering, and a third method wherein a tungsten film is deposited by CVD using $WF_6$ gas on a titanium nitride film deposited by chemical vapor deposition (CVD).

In accordance with the first or second method wherein the titanium nitride film is deposited by sputtering, however, an insulating film formed under the titanium nitride film to serve as a gate insulating film is physically damaged by sputtering particles so that the reliability of the gate insulating film is lowered.

In accordance with the third method wherein the tungsten film is deposited by CVD using $WF_6$ gas on the titanium nitride film deposited by CVD, the problem that the gate insulating film is physically damaged by the sputtering particles can be circumvented but the problem is encountered that the reliability of the gate insulating film is lowered by fluorine contained in the tungsten film. According to the report made by H. Yang (IEDM Tech Dig. (1997) pp. 459–462), the problem is encountered if a tungsten film is deposited by CVD using $WF_6$ that a large amount of fluorine remains in the tungsten film and fluorine contained in the tungsten film penetrates the titanium nitride film to be diffused into the gate insulating film in a heat treatment process performed after the deposition of the tungsten film, which lowers the reliability of the gate insulating film.

SUMMARY OF THE INVENTION

In view of the foregoing, it is therefore an object of the present invention to provide a method for forming a gate electrode composed of a multilayer film comprising a lower-layer titanium nitride film and an upper layer tungsten film without lowering the reliability of a gate insulating film.

To attain the object, a method for fabricating a semiconductor device according to the present invention comprises the steps of: forming a first insulating film serving as a gate insulating film on a semiconductor substrate; depositing a titanium nitride film by chemical vapor deposition on the first insulating film; depositing a tungsten film by sputtering on the titanium nitride film; and patterning a multilayer film comprising the tungsten film and the titanium nitride film to form a gate electrode composed of the multilayer film.

In accordance with the method for fabricating a semiconductor device according to the present invention, the titanium nitride film is deposited by CVD on the first insulating film as the gate insulating film, so that the first insulating film is prevented from being physically damaged and the reliability of the gate insulating film composed of the first insulating film is improved.

Since the tungsten film is deposited by sputtering, there can be prevented the degradation of the gate insulating film resulting from fluorine contained in such a tungsten film as deposited by CVD using $WF_6$ gas.

Since the tungsten film is deposited by sputtering, moreover, the degree of roughness of the surface of the tungsten film is reduced. This reduces the amount of overetching performed in forming the gate electrode by patterning the multilayer film comprising the tungsten film and the titanium nitride film and prevents penetration through the gate insulating film caused by overetching.

In accordance with the method for fabricating a semiconductor device according to the present invention, therefore, the gate electrode with a low resistance value can be formed without lowering the reliability of the gate insulating film so that a high-performance and high-reliability MOSFET is fabricated.

In the method for fabricating a semiconductor device according to the present invention, the step of depositing the titanium nitride film preferably includes the step of performing a heat treatment with respect to the titanium nitride film in an ammonia atmosphere.

The arrangement lowers the concentration of a residual impurity which is present. in the titanium nitride film and thereby prevents an increase in gate leakage current and the peeling of the titanium nitride film off the surface of the gate insulating film even if a heat treatment is performed at about 1000° C. with respect to the titanium nitride film in the subsequent step.

In this case, the step of performing the heat treatment with respect to the titanium nitride film is preferably performed in a chamber in which the titanium nitride film has been deposited.

The arrangement lowers the concentration of the residual impurity which is present in the titanium nitride film without increasing process steps.

In the method for fabricating a semiconductor device according to the present invention, the step of depositing the titanium nitride film preferably includes the step of performing a heat treatment with respect to the titanium nitride film at a temperature not less than a temperature at which the titanium nitride film is deposited.

The arrangement lowers the concentration of a residual impurity which is present in the titanium nitride film and thereby prevents an increase in gate leakage current and the peeling of the titanium nitride film off the surface of the gate insulating film even if a heat treatment is performed at about 1000° C. with respect to the titanium nitride film in the subsequent step.

In this case, the heat treatment is preferably performed in an ammonia atmosphere.

The arrangement further lowers the concentration of the residual impurity which is present in the titanium nitride film.

In the method for fabricating a semiconductor device according to the present invention, the step of depositing the titanium nitride film is preferably performed at a temperature not less than 600° C.

The arrangement lowers the concentration of the residual impurity which is present in the titanium nitride film and thereby prevents an increase in gate leakage current and the peeling of the titanium nitride film off the surface of the gate insulating film even if a heat treatment is performed at about 1000° C. with respect to the titanium nitride film in the subsequent step.

Preferably, the method for fabricating a semiconductor device according to the present invention further comprises, between the step of depositing the titanium nitride film and the step of depositing the tungsten film, the step of: forming a second insulating film on the titanium nitride film and patterning the second insulating film to form a capacitor insulating film, wherein the step of patterning the multilayer film to form the gate electrode includes the step of: forming an upper electrode of a capacitor composed of the tungsten film and a lower electrode of the capacitor composed of the titanium nitride film.

The arrangement allows formation of the semiconductor device comprising the capacitor with reduced variations in the characteristics of the electrode and reduced degradation of RF properties without increasing the number of process steps.

Preferably, the method for fabricating a semiconductor device according to the present invention further comprises, between the step of depositing the titanium nitride film and the step of depositing the tungsten film, the step of: forming a second insulating film on the titanium nitride film and patterning the second insulating film to form a hard mask composed of the second insulating film above the isolation region, wherein the step of patterning the multilayer film to form the gate electrode includes the step of: patterning the titanium nitride film by using the hard mask to form a resistor composed of the titanium nitride film.

The arrangement allows formation of the semiconductor device comprising the resistor with a high sheet resistance value without increasing the number of process steps.

In this case, it is preferred that a thickness of the second insulating film is approximately equal to or less than a height of a portion of the isolation region protruding from the semiconductor substrate.

In the arrangement, the thickness of the tungsten film remaining on each of the side surfaces of the hard mask overlying the titanium nitride film is approximately equal to or less than the thickness of the tungsten film remaining on the portion of the titanium nitride film overlying the stepped portion of the isolation region. Accordingly, the tungsten film remaining on each of the side surfaces of the hard mask overlying the titanium nitride film is removed by overetching for removing the tungsten film remaining on the portion of the titanium nitride film overlying the stepped portion of the isolation region, so that variations in the characteristics of the resistor are prevented.

A first semiconductor device according to the present invention comprises: a multilayer gate electrode comprised of a lower-layer gate electrode composed of a titanium nitride film deposited by chemical vapor deposition on a semiconductor substrate and of an upper-layer gate electrode composed of a tungsten film deposited by sputtering on the titanium nitride film; and a capacitor comprised of a lower electrode composed of the titanium nitride film, of a capacitor insulating film formed on the lower electrode, and of an upper electrode composed of the tungsten film formed on the capacitor insulating film.

The first semiconductor device according to the present invention implements a semiconductor device comprising a reliable gate electrode and a capacitor with reduced variations in the characteristics of the electrode and reduced degradation of RF characteristics.

A second semiconductor device according to the present invention comprises: a multilayer gate electrode comprised of a lower-layer gate electrode composed of a titanium nitride film deposited by chemical vapor deposition on a semiconductor substrate and of an upper-layer gate electrode composed of a tungsten film deposited by sputtering on the titanium nitride film; and a resistor composed of the titanium nitride film.

The second semiconductor device according to the present invention implements a semiconductor device comprising a reliable gate electrode and a resistor with a high sheet resistance value.

DETAILED DESCRIPTION OF THE INVENTION

Embodiment 1

A method for fabricating a semiconductor device having an n-type MOSFET as EMBODIMENT 1 of the present invention will be described with reference to FIGS. 1(a) to (c).

Figure 1A:
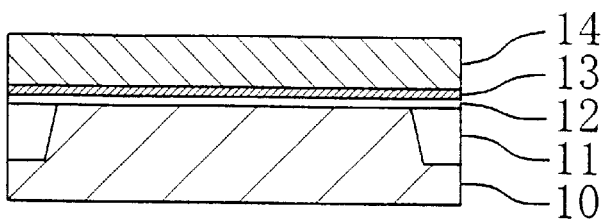
FIGS. 1(a) to (c) are cross-sectional views illustrating the individual process steps of methods for fabricating semiconductor devices according to EMBODIMENTS 1 to 4.

First, as shown in FIG. 1(a), an isolation region 11 is formed by a well-known method in a surface portion of a semiconductor substrate 10 composed of, e.g., a p-type silicon substrate. Then, a silicon oxynitride film 12 with a thickness of about 2 nm as a gate insulating film is formed on the semiconductor substrate 10.

Next, a titanium nitride film 13 with a thickness of about 10 to 20 nm is deposited on the silicon oxynitride film 12 by CVD which is performed at a film deposition temperature of about 490° C. by using $TiCl_4$ and $NH_3$ as source gas. Subsequently, a tungsten film 14 with a thickness of about 100 nm is deposited by sputtering on the titanium nitride film 13.

Figure 1B:
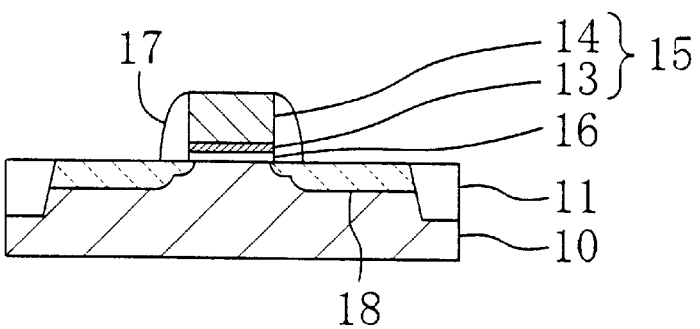

Next, as shown in FIG. 1(b), the multilayer film comprising the tungsten film 14 and the titanium nitride film 13 and the silicon oxynitride film 12 are patterned to form a gate electrode 15 composed of the multilayer film comprising the tungsten film 14 and the titanium nitride film 13 and form a gate insulating film 16 composed of the silicon oxynitride film 12. Then, an n-type impurity such as arsenic (As) is ion implanted into the semiconductor substrate 10 by using the gate electrode 15 as a mask with an implant energy of about 8 keV, whereby a lightly doped n-type impurity layer is formed. Subsequently, a silicon nitride film with a thickness of about 50 nm is formed over the entire surface of the semiconductor substrate 10 and then subjected to anisotropical etching, thereby forming sidewalls 17 composed of the silicon nitride film on the side surfaces of the gate electrode 15. Thereafter, an n-type impurity such as arsenic is ion implanted into the semiconductor substrate 10 by using the gate electrode 15 and the sidewalls 17 as a mask with an implant energy of about 40 keV, whereby a heavily doped n-type impurity layer is formed and impurity diffused layers 18 each composed of the lightly doped n-type impurity layer and the heavily doped n-type impurity layer and serving as a source or drain region are formed.

Figure 1C:
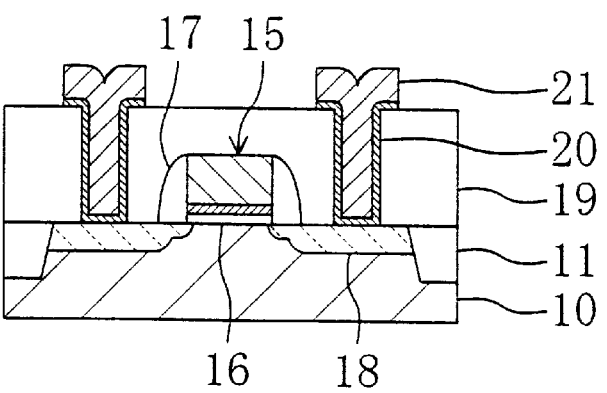

Next, as shown in FIG. 1(c), an interlayer insulating film 19 composed of, e.g., a silicon oxide film is deposited over the entire surface of the semiconductor substrate 10. Then, contact holes are formed in the interlayer insulating film 19. Subsequently, a conductive film having a barrier layer is deposited to fill in the contact holes and then patterned to form contacts 20 and wiring layers 21.

Since EMBODIMENT 1 deposits the titanium nitride film 13 by CVD on the silicon oxynitride film 12 as the gate insulating film 16, the silicon oxynitride film is prevented from being physically damaged so that the reliability of the gate insulating film 16 composed of the silicon oxynitride film 12 is improved.

Since the titanium nitride film 13 is deposited by CVD at a low temperature of about 490° C., the rate at which the titanium nitride film 13 is deposited becomes lower. As a consequence, the titanium nitride film 13 with a smaller thickness can be deposited with excellent controllability.

Since the tungsten film 14 is deposited by sputtering, there can be prevented the degradation of the gate insulating film 16 resulting from fluorine contained in the tungsten film 14 more positively than in the case where a tungsten film is deposited by CVD using $WF_6$ gas.

Since the gate electrode 15 is composed of the multilayer film comprising the thin titanium nitride film 13 having a thickness of about 10 to 20 nm and the thick tungsten film 14 having a low resistance value and a thickness of about 100 nm, the gate electrode 15 can be reduced in resistance.

Figure 2A:
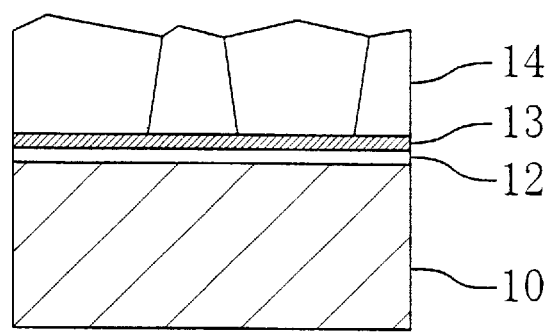
FIG. 2(a) is a cross-sectional view showing a crystal structure of a tungsten film deposited by CVD on a titanium nitride film and FIG. 2(b) is a cross-sectional view-showing a crystal structure of a tungsten film deposited by sputtering on a titanium nitride film.
Figure 2B:
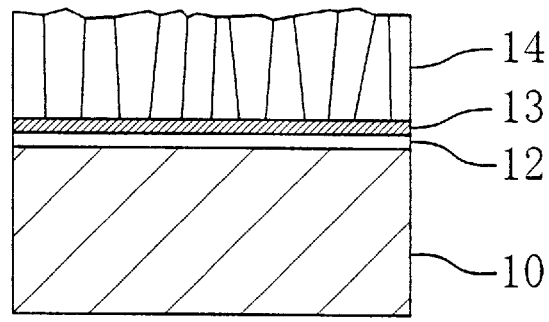

FIGS. 2(a) and (b) show the crystal structures of the tungsten films 14 each deposited on the titanium nitride film 13, of which FIG. 2(a) shows the tungsten film 14 deposited by CVD and FIG. 2(b) shows the tungsten film 14 formed by sputtering. As can be seen from the comparison between FIGS. 2(a) and (b), the degree of surface roughness resulting from crystal grains is smaller at the tungsten film 14 deposited by sputtering than at the tungsten film 14 deposited by CVD.

If the tungsten film 14 is deposited by sputtering as in EMBODIMENT 1, the amount of overetching performed in forming the gate electrode 15 by pattering the multilayer film comprising the tungsten film 14 and the titanium nitride film 13 can be reduced, so that penetration through the gate insulating film 16 caused by overetching is suppressed.

Embodiment 2

A method for fabricating a semiconductor device having an n-type MOSFET as EMBODIMENT 2 of the present invention will be described with reference to FIGS. 1(a) to (c).

First, as shown in FIG. 1(a), an isolation region 11 is formed in a surface portion of a semiconductor substrate 10 composed of, e.g., a p-type silicon substrate, similarly to EMBODIMENT 1. Then, a silicon oxynitride film 12 with a thickness of about 2 nm as a gate insulating film is formed on the semiconductor substrate 10.

Next, a gas mixture of $TiCl_4$ and $NH_3$ as source gas is introduced into a chamber which is held at a temperature of about 490° C. and a titanium nitride film 13 with a thickness of about 10 to 20 nm is deposited by CVD on the silicon oxynitride film 12. Thereafter, the atmosphere within the chamber is changed to $NH_3$ while the semiconductor substrate 10 is held continuously in the chamber and the temperature within the chamber is held at a temperature not less than the film deposition temperature (490° C.) for the titanium nitride film 13. The semiconductor substrate 10 is held under these conditions for about 3 to 10 minutes.

Next, a tungsten film 14 with a thickness of about 100 nm is deposited by sputtering on the titanium nitride film 13, similarly to EMBODIMENT 1. Then, as shown in FIG. 1(b), a multilayer film comprising the tungsten film 14 and the titanium nitride film 13 and the silicon oxynitride film 12 are patterned to form a gate electrode 15 and a gate insulating film 16.

Next, sidewalls 17 are formed on the side surfaces of the gate electrode 15 and impurity diffused layers 18 each serving as a source or drain region are formed in the semiconductor substrate 10, similarly to EMBODIMENT 1. Thereafter, an interlayer insulating film 19, contacts 20, and a wiring layer 21 are formed, as shown in FIG. 1(c).

The present inventors noticed that, when the titanium nitride film 13 was formed by CVD using the source gas composed of the gas mixture of $TiCl_4$ and $NH_3$, a gate leakage current was increased by the heat treatment performed subsequently, e.g., a heat treatment at about 1000° C. for activating the impurity diffusion layers 18 each serving as the source or drain region.

Then, the present inventors examined the reason that the leakage current was increased by the heat treatment performed at about 1000° C. after the deposition of the titanium nitride film 13 and found the following cause of the increased leakage current.

When the titanium nitride film 13 was deposited by CVD using the source gas composed of the gas mixture of $TiCl_4$ and $NH_3$, the reaction of $6TiCl_4+8NH_3 \rightarrow 6TiN+24HCl+N_2$ occurred to deposit the titanium nitride film 13, so that chlorine remained in the titanium nitride film 13. Consequently, when the heat treatment at about 1000° C. was performed with respect to the titanium nitride film 13, chlorine remaining in the titanium nitride film 13 was diffused into the gate insulating film 16 in the heat treatment process, whereby the gate leakage current was increased.

If the thickness of the gate insulating film 16 was increased, the gate leakage current was increased against expectations.

Figure 3:
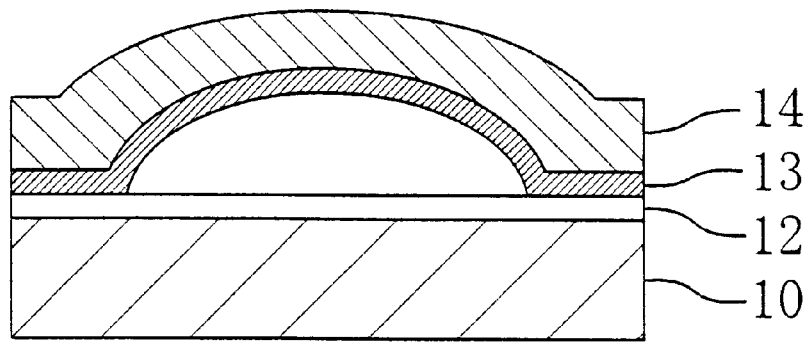
FIG. 3 is a cross-sectional view for illustrating a problem encountered when a heat treatment at about 1000° C. is performed with respect to a multilayer film consisting of a lower-layer titanium nitride film and an upper-layer tungsten film.

FIG. 3 shows a cross-sectional structure when the heat treatment at about 1000° C. was performed after the tungsten film 14 was thus deposited on the titanium nitride film 13. As shown in FIG. 3, the outward diffusion path of the residual chlorine evaporated from the titanium nitride film 13 is closed so that the residual chlorine resides between the silicon oxynitride film 12 as the gate insulating film and the titanium nitride film 13. As a result, the titanium nitride film 13 peels off the surface of the gate insulating film. The phenomenon is particularly marked when the titanium nitride film 13 is deposited at a low temperature for the improved quality of the titanium nitride film 13.

As a method for reducing the residual chlorine in the titanium nitride film 13, Japanese Patent Publication No. 2803556 discloses a method wherein a plasma is applied to the titanium nitride film 13. In accordance with the method, however, the gate insulating film 16 is damaged by the applied plasma and the reliability of the gate insulating film 16 may be lowered thereby.

EMBODIMENT 2 is for preventing an increase in gate leakage current and the peeling of the titanium nitride film 13 off the surface of the gate insulating film without degrading the gate insulating film 16 even if a heat treatment is performed at about 1000° C. with respect to the titanium nitride film 13. As stated previously, the atmosphere within the chamber is changed to $NH_3$ while the semiconductor substrate 10 is held continuously in the chamber in which the titanium nitride film 13 has been deposited and the temperature within the chamber is maintained at a temperature not less than the film deposition temperature for the titanium nitride film 13.

Figure 4:
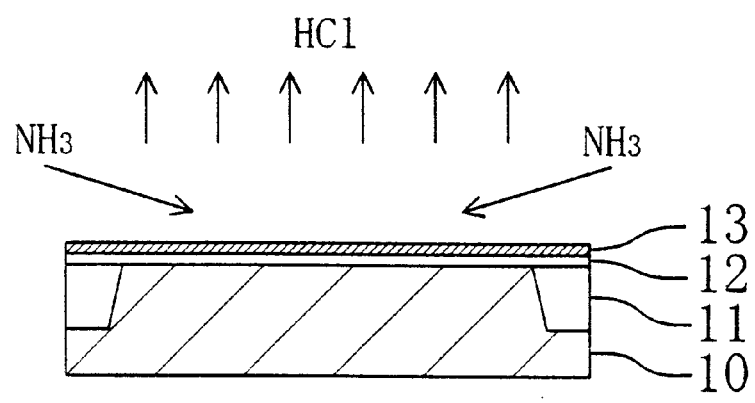
FIG. 4 is a cross-sectional view for illustrating the effects of the method for fabricating a semiconductor device according to EMBODIMENT 2.

If the titanium nitride film 13 is thus held in the $NH_3$ atmosphere at a temperature not less than the film deposition temperature, unreacted $TiCl_4$ and $NH_3$ which are present in the titanium nitride film 13 react to generate HCl, as shown in FIG. 4. Since the generated HCl evaporates, the residual chlorine in the titanium nitride film 13 is reduced.

Figure 5:
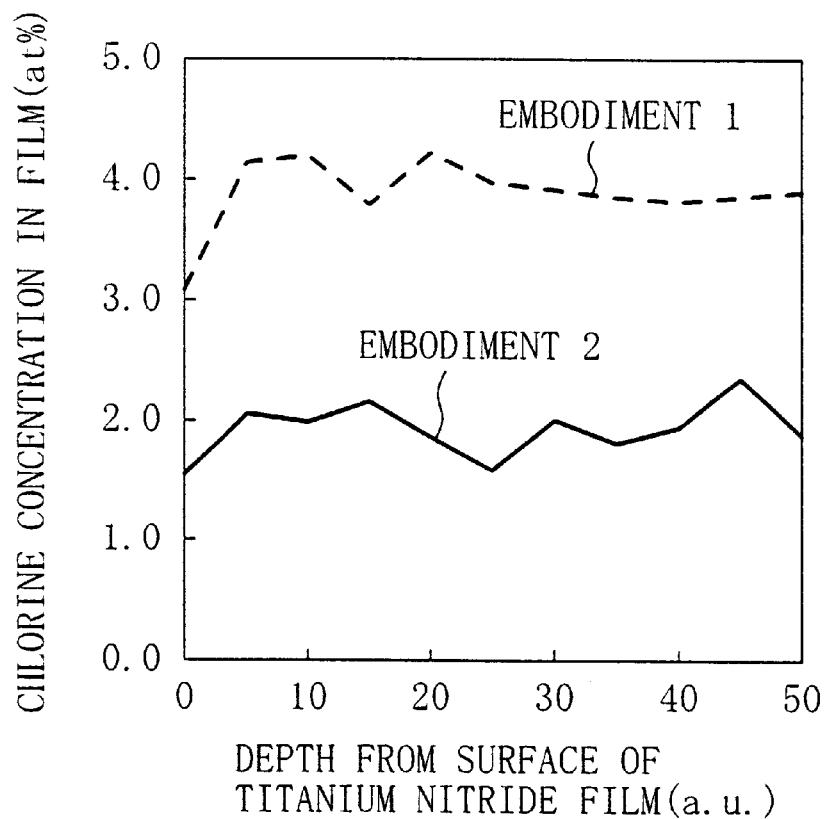
FIG. 5 shows the relationship between a depth measured from a surface of each of the titanium nitride films obtained according to EMBODIMENTS 1 and 2 and the chlorine concentration in each of the titanium nitride films.

FIG. 5 shows the relationship between a depth measured from a surface of the titanium nitride film 13 and the chlorine concentration in the nitride film 13 measured by using XPS. In FIG. 5, the broken line represents EMBODIMENT 1 (the case in which a heat treatment is not performed with respect to the titanium nitride film 13 deposited at 490° C.) and the solid line represents EMBODIMENT 2 (the case in which the heat treatment is performed in the ammonia atmosphere with respect to the titanium nitride film 13 deposited at 490° C.).

As can be seen from FIG. 5, if the heat treatment is performed in the ammonia atmosphere with respect to the titanium nitride film 13 as in EMBODIMENT 2, the concentration of chlorine in the titanium nitride film 13 can be reduced significantly to about 2 at %.

Thus, EMBODIMENT 2 not only achieves the effects achieved by EMBODIMENT 1 but also reduces the residual chlorine in the titanium nitride film 13 by reducing the residual chlorine in the titanium nitride film 13 and thereby prevents the peeling of the titanium nitride film 13 off the surface of the gate insulating film.

Since EMBODIMENT 2 enables the deposition of the titanium nitride film 13 and the removal of the residual chlorine by using a single chamber and merely changing the gas introduced into the chamber, the residual chlorine can be removed while an increase in process steps is suppressed.

Although EMBODIMENT 2 has used the gas mixture of $TiCl_4$ and $NH_3$ as the source gas for depositing the titanium nitride film 13, it is also possible to deposit the titanium nitride film 13 by using a gas mixture of $TiI_4$ and $NH_3$ or a gas mixture of $TiBr_4$ and $NH_3$ instead. In this case also, iodine (I) or bromine (Br) remaining in the titanium nitride film 13 can be reduced by holding the titanium nitride film 13 in the $NH_3$ atmosphere at a temperature not less than the film deposition temperature.

Embodiment 3

A method for fabricating a semiconductor device having an n-type MOSFET as EMBODIMENT 3 of the present invention will be described with reference to FIGS. 1(a) to (c).

First, as shown in FIG. 1(a), an isolation region 11 is formed in a surface portion of a semiconductor substrate 10 composed of, e.g., a p-type silicon substrate, similarly to EMBODIMENT 1. Then, a silicon oxynitride film 12 with a thickness of about 2 nm as a gate insulating film is formed on the semiconductor substrate 10.

Next, a titanium nitride film 13 with a thickness of about 10 nm is deposited on the silicon oxynitride film 12 by CVD which is performed at a temperature of about 490° C. by using a gas mixture of $TiCl_4$ and $NH_3$ as source gas. Thereafter, rapid thermal annealing is performed for about 10 to 60 seconds in an $NH_3$ atmosphere at a temperature of 600 to 900° C. with respect to the titanium nitride film 13.

Next, a tungsten film 14 with a thickness of about 100 nm is deposited by sputtering on the titanium nitride film 13, similarly to EMBODIMENT 1. Then, as shown in FIG. 1(b), a multilayer film comprising the tungsten film 14 and the titanium nitride film 13 and the silicon oxynitride film 12 are patterned to form a gate electrode 15 and a gate insulating film 16.

Next, sidewalls 17 are formed on the side surfaces of the gate electrode 15 and impurity diffused layers 18 each serving as a source or drain region are formed in the semiconductor substrate 10, similarly to EMBODIMENT 1. Then, an interlayer insulating film 19, contacts 20, and a wiring layer 21 are formed, as shown in FIG. 1(c).

Figure 6:
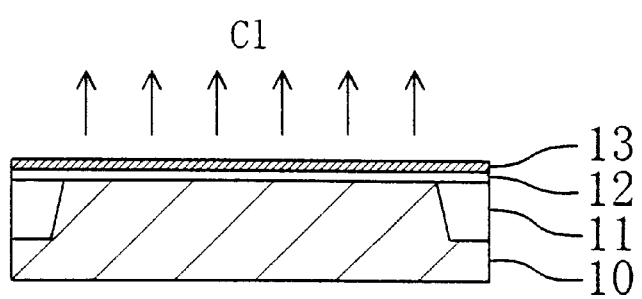
FIG. 6 is a cross-sectional view for illustrating the effects of the method for fabricating a semiconductor device according to EMBODIMENT 3.

If the rapid thermal annealing is performed in the $NH_3$ atmosphere with respect to the titanium nitride film 13 as in EMBODIMENT 3, Cl which is present in the titanium nitride film 13 evaporates, as shown in FIG. 6, so that residual chlorine in the titanium nitride film 13 is reduced. Since the heat treatment is performed in the $NH_3$ atmosphere, a phenomenon occurs in which unreacted $TiC_4$ and $NH_3$ which are present in the titanium nitride film 13 react to generate HCl and the generated HCl evaporates.

Thus, EMBODIMENT 3 not only achieves the effects achieved by EMBODIMENT 1 but also reduces a gate leakage current by reducing the residual chlorine in the titanium nitride film 13 and thereby prevents the peeling of the titanium nitride film 13 off the surface the gate insulating film.

Since EMBODIMENT 3 evaporates the residual chlorine by the rapid thermal annealing, a long-time heat treatment is not performed with respect to the semiconductor substrate 10. This suppresses damage caused by the heat treatment to the semiconductor device.

Although EMBODIMENT 3 has performed the rapid thermal annealing in the ammonia gas atmosphere, it is also possible to perform rapid thermal annealing in a nitrogen gas atmosphere, a gas mixture atmosphere of nitrogen gas and hydrogen gas, an argon gas atmosphere, or vacuum.

Although EMBODIMENT 3 has used the gas mixture of $TiCl_4$ and $NH_3$ as the source gas for depositing the titanium nitride film 13, it is also possible to deposit the titanium nitride film 13 by using a gas mixture of $TiI_4$ and $NH_3$ or a gas mixture of $TiBr_4$ and $NH_3$. In this case also, iodine or bromine which is present in the titanium nitride film 13 can be reduced by performing rapid thermal annealing with respect to the titanium nitride film 13.

Embodiment 4

A method for fabricating a semiconductor device having an n-type MOSFET as EMBODIMENT 4 of the present invention will be described with reference to FIGS. 1(a) to (c).

First, as shown in FIG. 1(a), an isolation region 11 is formed in a surface portion of a semiconductor substrate 10 composed of, e.g., a p-type silicon substrate, similarly to EMBODIMENT 1. Then, a silicon oxynitride film 12 with a thickness of about 2 nm as a gate insulating film is formed on the semiconductor substrate 10.

Next, a titanium nitride film 13 with a thickness of about 10 nm is deposited on the silicon oxynitride film 12 by CVD which is performed at about 650° C. by using a gas mixture of $TiCl_4$ and $NH_3$ as source gas.

Next, a tungsten film 14 with a thickness of about 100 nm is deposited by sputtering on the titanium nitride film 13, similarly to EMBODIMENT 1. Then, as shown in FIG. 1(b), a multilayer film comprising the tungsten film 14 and the titanium nitride film 13 and the silicon oxynitride film 12 are patterned to form a gate electrode 15 and a gate insulating film 16.

Next, sidewalls 17 are formed on the side surfaces of the gate electrode 15 and impurity diffused layers 18 each serving as a source or drain region are formed in the semiconductor substrate 10, similarly to EMBODIMENT 1. Then, an interlayer insulating film 19, contacts 20, and a wiring layer 21 are formed, as shown in FIG. 1(c).

Since EMBODIMENT 4 forms the titanium nitride film at a high temperature, the concentration of residual chlorine in the titanium nitride film can be reduced.

Figure 7:
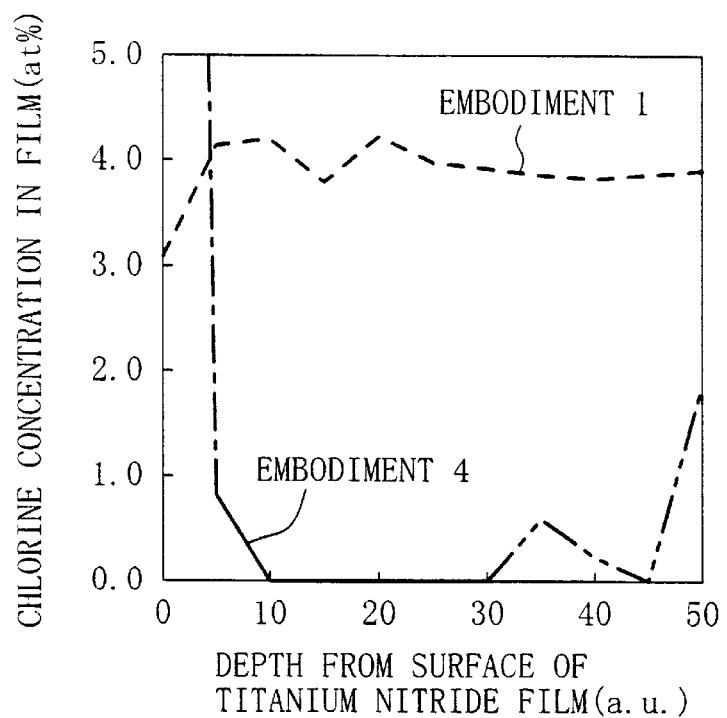
FIG. 7 shows the relationship between a depth measured from a surface of each of the titanium nitride films obtained according to EMBODIMENTS 1 and 4 and the chlorine concentration in each of the titanium nitride films.

FIG. 7 shows the relationship between a depth measured from a surface of the titanium nitride film 13 and the chlorine concentration in the titanium nitride film 13 measured by using XPS. In FIG. 7, the broken line represents EMBODIMENT 1 (the case in which a heat treatment is not performed with respect to the titanium nitride film 13 deposited at 490° C.) and the solid line represents EMBODIMENT 4 (the case in which the heat treatment is not performed with respect to the titanium nitride film 13 deposited at 650° C.). In FIG. 7, a portion indicated by the dot-dash line results from the surface contamination of the titanium nitride film 13 and a portion indicated by the two-dot-dash line shows a measurement error.

As can be seen from FIG. 7, if the titanium nitride film 13 is deposited at a temperature of 650° C. as in EMBODIMENT 4, the chlorine concentration in the titanium nitride film 13 can be reduced significantly to about 2 at %.

Figure 8:
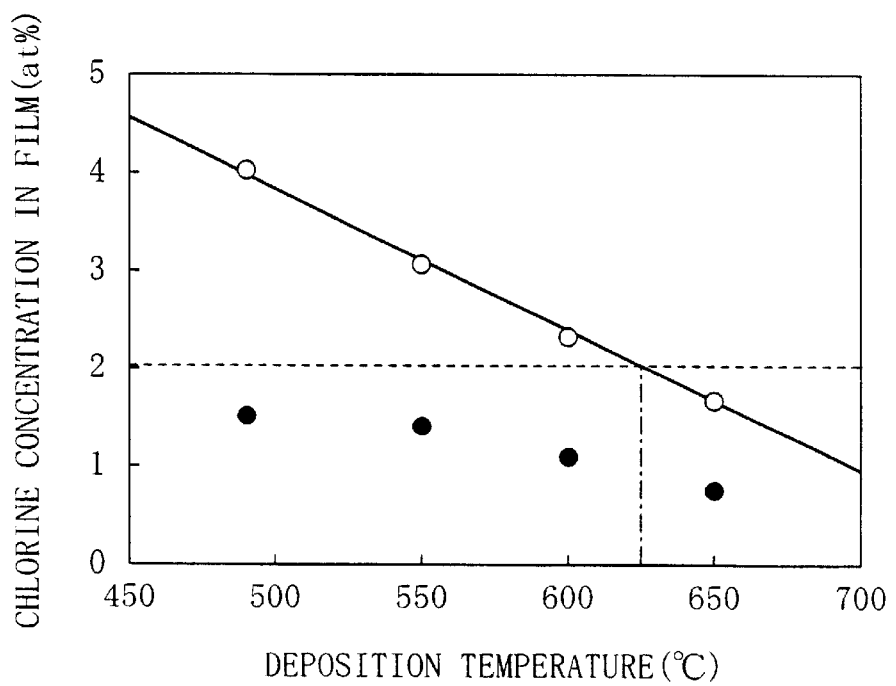
FIG. 8 shows the relationship between the film deposition temperature for a titanium nitride film and the chlorine concentration in the titanium nitride film in EMBODIMENT 4.

FIG. 8 shows the relationship between the film deposition temperature for the titanium nitride film 13 and the chlorine concentration. In FIG. 8, ○ represents the chlorine concentration in the film before the heat treatment and ● represents the chlorine concentration in the film after the heat treatment. As can be seen from FIG. 8, the chlorine concentration before and after the heat treatment is lower as the film deposition temperature is higher.

Figures 9, 10:
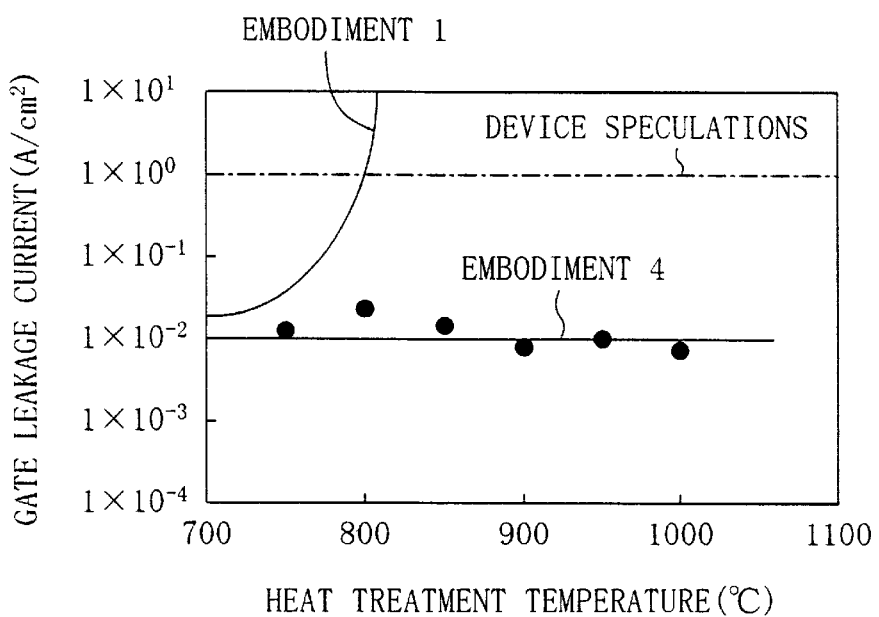
FIG. 9 shows the residual chlorine concentration in each of the titanium nitride films obtained according to EMBODIMENTS 1 and 4 and a gate leakage current value in a MOS capacitor when a heat treatment is performed with respect to each of the titanium nitride films.
FIG. 10 shows the relationship between the heat treatment temperature for each of the titanium nitride films obtained according to EMBODIMENTS 1 and 4 and a gate leakage current value in the MOS capacitor.

FIG. 9 shows the respective concentrations of residual chlorine in the titanium nitride films 13 deposited on the gate insulating films 16 with a thickness of 3.5 nm at the film deposition temperatures of 650° C. (EMBODIMENT 4) and 490° C. (EMBODIMENT 1) by CVD using source gas composed of a gas mixture of $TiCl_4$ and $NH_3$ and respective gate leakage current values in MOS capacitors when a heat treatment was performed at 1000° C. for 10 seconds with respect to the titanium nitride films 13.

As can be seen from FIG. 9, the amount of residual chlorine after the heat treatment is smaller as the film deposition temperature is higher and the gate leakage current is reduced thereby. This indicates that, according to EMBODIMENT 4, the gate leakage current can be reduced even if the heat treatment at about 1000° C. for activating the impurity diffused layers 18 each serving as the source or drain region is performed.

FIG. 10 shows the relationship between the heat treatment temperatures for the titanium nitride films 13 deposited on the gate insulating film 16 with a thickness of 2.4 nm at the film deposition temperatures of 650° C. (EMBODIMENT 4) and 490° C. (EMBODIMENT 1) by CVD using source gas composed of $TiCl_4$ and $NH_3$ and gate leakage current values in MOS capacitors.

As can be seen from FIG. 10, a gate leakage current value hardly changes even if the heat treatment is performed with respect to the titanium nitride film 13.

EMBODIMENT 4 not only achieves the effects achieved by EMBODIMENT 1 but also reduces the gate leakage current by reducing the residual chlorine in the titanium nitride film 13 and thereby prevents the peeling of the titanium nitride film 13 off the surface of the gate insulating film.

Since EMBODIMENT 4 deposits the titanium nitride film 13 at a high temperature, the rate at which the film is deposited becomes higher than the rate at which the film is formed at a lower temperature. This makes it difficult to form the titanium nitride film 13 with a smaller thickness but it is possible to form the titanium nitride film 13 with a thickness of about 20 nm.

Although EMBODIMENT 4 has used the gas mixture of $TiCi_4$ and $NH_3$ as the source gas for depositing the titanium nitride film 13, it is also possible to deposit the titanium nitride film 13 by using a gas mixture of $TiI_4$ and $NH_3$ or a gas mixture of $TiBr_4$ and $NH_3$. In this case also, iodine or bromine which is present in the titanium nitride film 13 can be reduced.

Embodiment 5

A method for fabricating a semiconductor device having an n-type MOSFET and a capacitor as EMBODIMENT 5 of the present invention will be described with reference to FIGS. 11(a) to (c) and FIGS. 12(a) to (c).

Figure 11A:
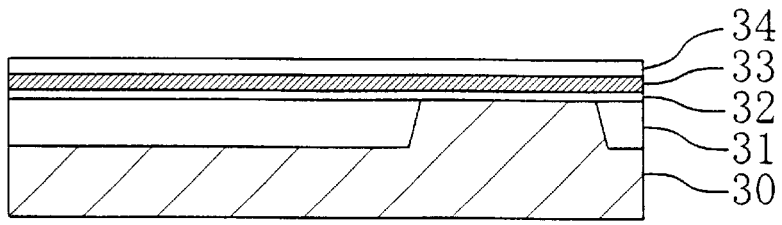
FIGS. 11(a) to (c) are cross-sectional views illustrating the individual process steps of a method for fabricating a semiconductor device according to EMBODIMENT 5.

First, as shown in FIG. 11(a), an isolation region 31 is formed by a well-known method in a surface portion of a semiconductor substrate 30 composed of, e.g., a p-type silicon substrate. Then, a silicon oxynitride film 32 with a thickness of about 2 nm as a gate insulating film is formed on the semiconductor substrate 30.

Next, a titanium nitride film 33 having a thickness of about 10 to 20 nm and serving as a lower-layer gate electrode and a lower electrode of a capacitor is deposited on the silicon oxynitride film 32 by CVD which is performed at a temperature of about 490° C. by using $TiCl_4$ and $NH_3$ as source gas. Then, a silicon oxide film 34 having a thickness of about 5 to 10 nm and serving as a capacitor insulating film is formed on the titanium nitride film 33.

Figure 11B:
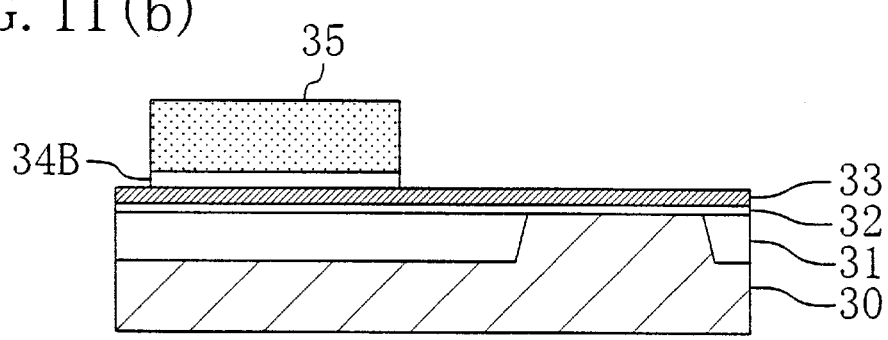

Next, as shown in FIG. 11(b), a first resist pattern 35 is formed on the silicon oxide film 34. Then, the silicon oxide film 34 is etched by using, e.g., a dilute hydrofluoric acid solution and the first resist pattern 35 as a mask, whereby a capacitor insulating film 34B composed of the silicon oxide film 34 is formed.

Figure 11C:
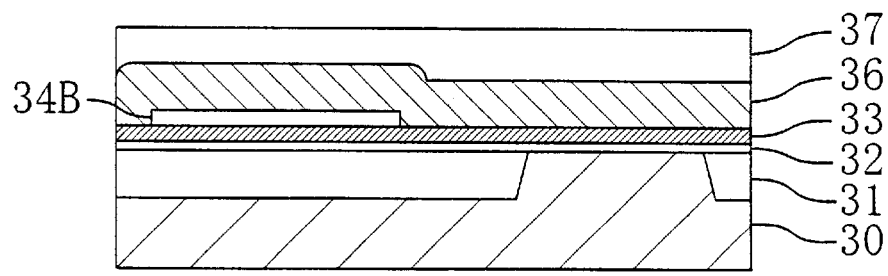

Next, after the first resist pattern 35 is removed, a tungsten film 36 having a thickness of about 100 nm and serving as an upper-layer gate electrode and an upper electrode of the capacitor is deposited by sputtering on the titanium nitride film 33 and the capacitor insulating film 34B, as shown in FIG. 11(c). Then, a silicon nitride film 37 having a thickness of about 100 nm and serving as a hard mask is formed on the tungsten film 36.

Figure 12A:
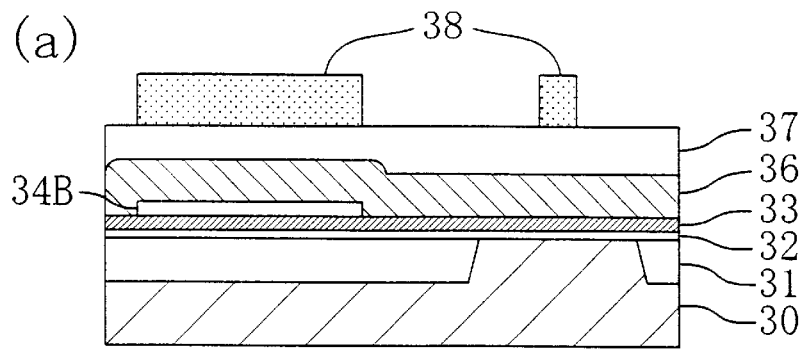
FIGS. 12(a) to (c) are cross-sectional views illustrating the individual process steps of the method for fabricating a semiconductor device according to EMBODIMENT 5.
Figure 12B:
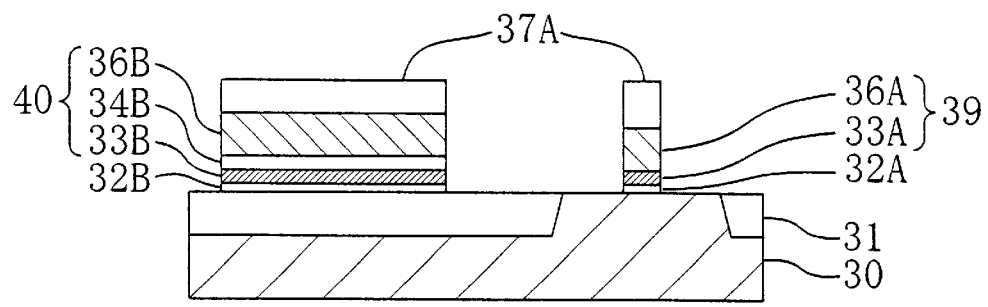

Next, as shown in FIG. 12(a), a second resist pattern 38 is formed on the silicon nitride film 37. Then, the silicon nitride film 37 is etched by using the second resist pattern 38 as a mask, whereby a hard mask 37A composed of the silicon nitride film 37 is formed, as shown in FIG. 12(b).

Next, the second resist pattern 38 is removed and then the tungsten film 36, the titanium nitride film 33, and the silicon oxynitride film 32 are patterned by using the hard mask 37A, whereby an upper-layer gate electrode 36A and an upper electrode 36B of the capacitor each composed of the tungsten film 36, a lower-layer gate electrode 33A and a lower electrode 33B of the capacitor each composed of the titanium nitride film 33, and a gate insulating film 32A and a patterned insulating film 32B each composed of the silicon oxynitride film 32 are formed. As a result, there are formed a gate electrode 39 composed of the upper-layer gate electrode 36A and the lower-layer gate electrode 33A and a capacitor 40 composed of the upper electrode 36B, the capacitor insulating film 34B, and the lower electrode 33B.

Figure 12C:
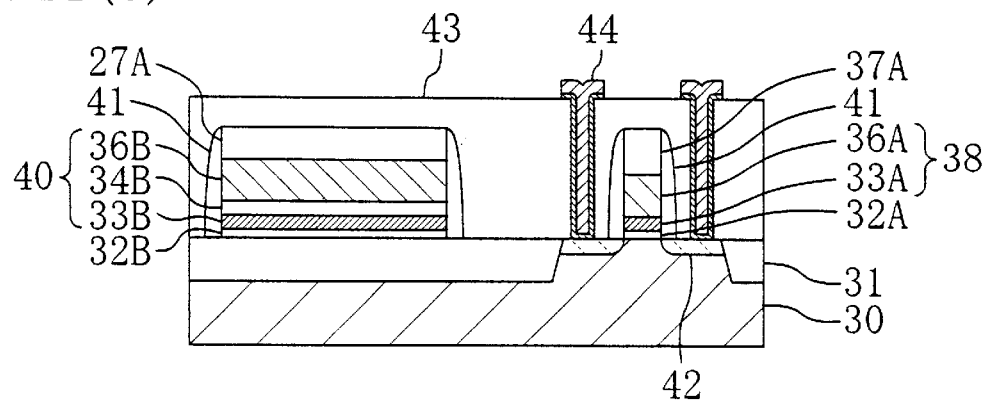

Next, sidewalls 41 are formed by a well-known method on the respective side surfaces of the gate electrode 39 and the capacitor 40, while impurity diffused layers 42 each serving as a source or drain are formed in the semiconductor substrate 30, as shown in FIG. 12(c).

Next, an interlayer insulating film 43 is formed entirely over the gate electrode 39 and the capacitor 40 and then contact holes are formed in the interlayer insulating film 43. Subsequently, a metal film is deposited on the interlayer insulating film 43 to fill in the contact holes and patterned to form contacts and metal wiring 44.

Thus, since the tungsten film 36 serving as the upper-layer gate electrode 36A is patterned to form the upper electrode 36B and the titanium nitride film 33 serving as the lower-layer gate electrode 33A is patterned to form the lower electrode 33B according to EMBODIMENT 5, the effect of forming the capacitor without increasing the number of process steps is achieved in addition to the effects achieved by EMBODIMENT 1.

Moreover, since the upper electrode 36B is composed of the tungsten film 36 and the lower electrode 33B is composed of the titanium nitride film 33, variations in the characteristics of the electrode and the degradation of RF characteristics as caused by a heat treatment during the fabrication process in an electrode composed of a polysilicon film doped with a conductive impurity do not occur. In other words, EMBODIMENT 5 achieves not only a reduction in process steps but also an improvement in the characteristics of the capacitor.

Embodiment 6

A method for fabricating a semiconductor device having an n-type MOSFET and a resistor as EMBODIMENT 6 of the present invention will be described with reference to FIGS. 13(a) to (c), FIGS. 14(a) to (c), FIGS. 15(a) and (b), and FIGS. 16(a) to (c).

Figure 13A:
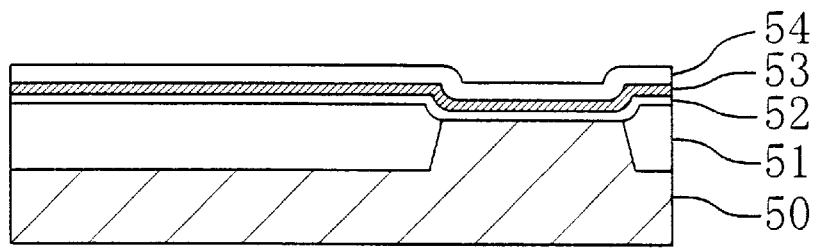
FIGS. 13(a) to (c) are cross-sectional views illustrating the individual process steps of a method for fabricating a semiconductor device according to EMBODIMENT 6.

First, as shown in FIG. 13(a), an isolation region 51 is formed by a well-known method in a surface portion of a semiconductor substrate 50 composed of, e.g., a p-type silicon substrate. Then, a silicon oxynitride film 52 with a thickness of about 2 nm as a gate insulating film is formed on the semiconductor substrate 50.

Next, a titanium nitride film 53 having a thickness of about 10 to 20 nm and serving as a lower-layer gate electrode and a resistor is deposited on the silicon oxynitride film 52 by CVD which is performed at a temperature of about 490° C. by using $TiCl_4$ and $NH_3$ as source gas. Then, a silicon oxide film 54 serving as a first hard mask 54A (see FIG. 13(b)) for forming a resistor-having a thickness of about 20 to 50 nm is formed on the titanium nitride film 53. As shown in FIG. 16(a), the silicon oxide film 54 is formed to have a thickness $t_1$ approximately equal to the height $t_2$ of that portion of the isolation region 51 protruding from the semiconductor substrate 50. The reason for this will be described later.

Figure 13B:
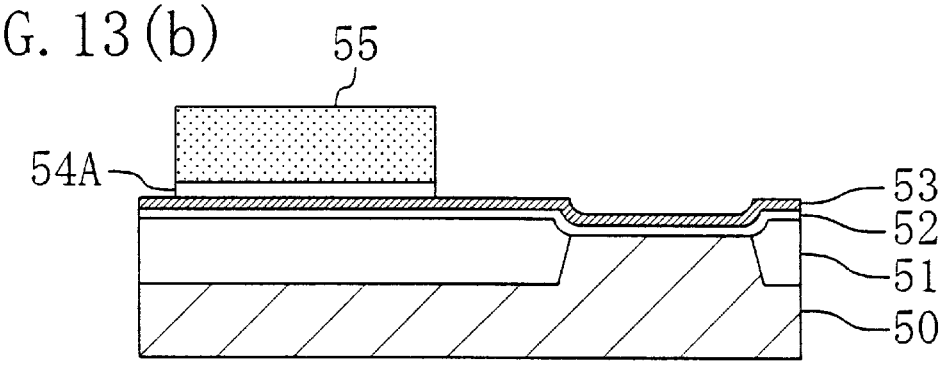

Next, as shown in FIG. 13(b), a first resist pattern 55 is formed on the silicon oxide film 54. Then, the silicon oxide film 54 is etched by using, e.g., a dilute hydrofluoric acid solution and the first resist pattern 55 as a mask, whereby a first hard mask 54A composed of the silicon oxide film 54 is formed.

Figure 13C:
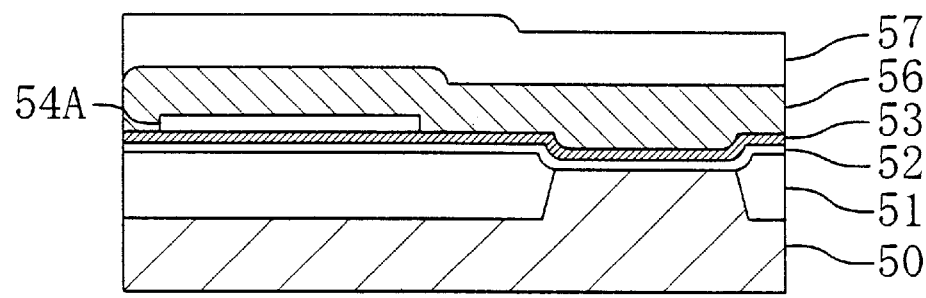

Next, after the first resist pattern 55 is removed, a tungsten film 56 having a thickness of about 100 nm and serving as an upper-layer gate electrode is deposited by sputtering on the titanium nitride film 53 and the first hard mask 54A, as shown in FIG. 13(c). Then, a silicon nitride film 57 having a thickness of about 100 nm and serving as a second hard mask for forming a gate electrode is formed on the tungsten film 56.

Figure 14A:
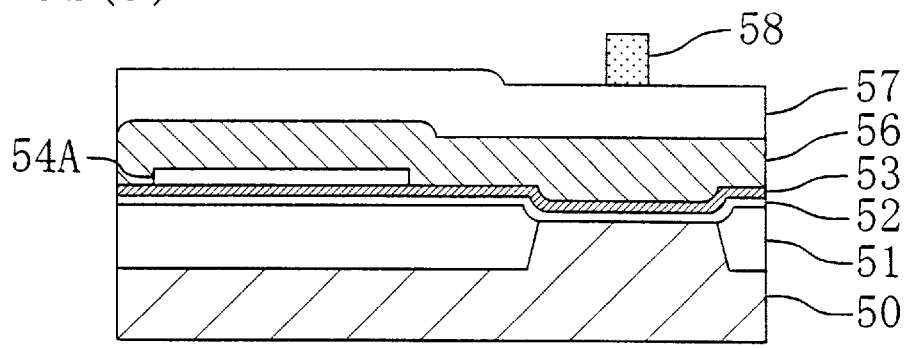
FIGS. 14(a) to (c) are cross-sectional views illustrating the individual process steps of the method for fabricating a semiconductor device according to EMBODIMENT 6.
Figure 14B:
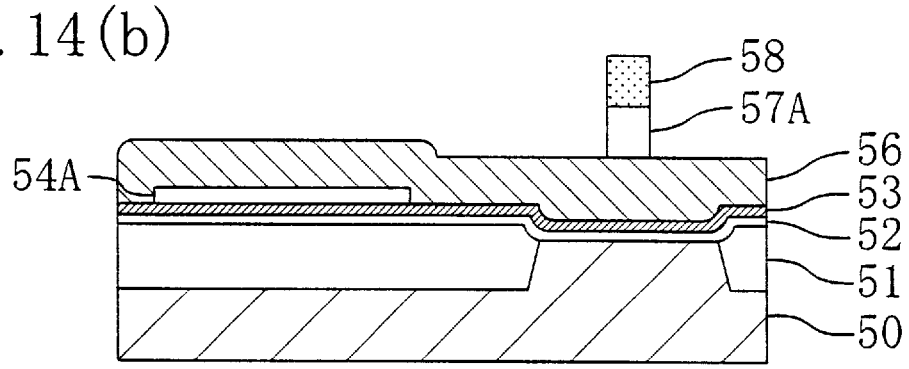

Next, as shown in FIG. 14(a), a second resist pattern 58 is formed on the silicon nitride film 57. Then, the silicon nitride film 57 is etched by using the second resist pattern 58 as a mask, whereby a second hard mask 57A composed of the silicon nitride film 57 is formed, as shown in FIG. 14(b). In this case, it is preferred to use etching gas having a selectivity to the tungsten film 56, such as etching gas containing a gas mixture of $CHF_3$ and $O_2$ as a main component, and perform sufficient overetching so as not to leave an etching residue 64 composed of the silicon nitride film 57 on the stepped portion of the tungsten film 56, as shown in FIG. 16(b).

Figure 14C:
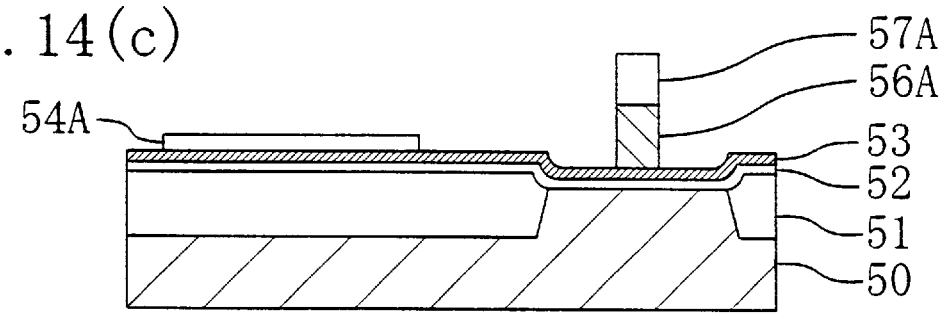

Next, after the second resist pattern 58 is removed, the tungsten film 56 is etched by using etching gas containing chlorine-based gas and the second hard mask 57A, whereby an upper-layer gate electrode 56A composed of the tungsten film 56 is formed, as shown in FIG. 14(c). Although the first hard mask 54A composed of the silicon oxide film 54 is exposed in the etching step, there is no possibility that the first hard mask 54A disappears because of the high etching selectivity of the tungsten film 56 to the silicon oxide film 54.

As stated previously, the thickness $t_1$ of the silicon oxide film 54 is approximately equal to the height $t_2$ of the portion of the isolation region 51 protruding from the semiconductor substrate 50. Accordingly, the thickness of the first tungsten film 65a remaining on each of the side surfaces of the first hard mask 54A overlying the titanium nitride film 53 is approximately equal to the thickness of the second tungsten film 65b remaining on the portion of the titanium nitride film 53 corresponding to the stepped portion of the isolation region 51, as shown in FIG. 16(c). Consequently, the first tungsten film 65a is removed by overetching for completely removing the second tungsten film 65b. The thickness $t_1$ of the silicon oxide film 54 is sufficient if it is equal to or less than the height of the stepped portion $t_2$ of the isolation region 51 protruding from the semiconductor substrate 50.

Figure 15A:
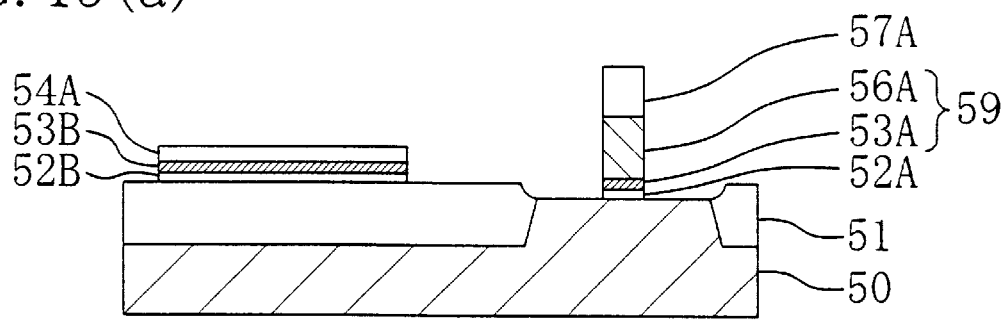
FIGS. 15(a) and (b) are cross-sectional views illustrating the individual process steps of the method for fabricating a semiconductor device according to EMBODIMENT 6.
Figure 16A:
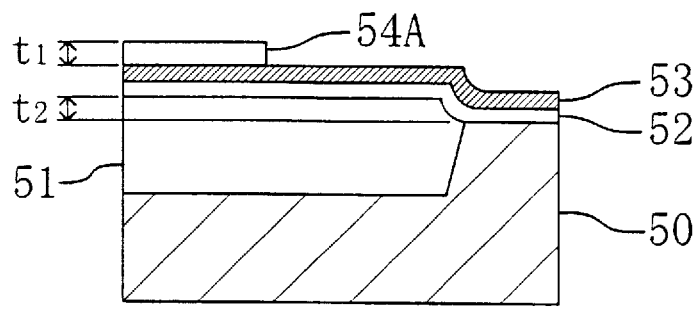
FIGS. 16(a) to (c) are cross-sectional views illustrating the characteristics of the individual process steps of the method for fabricating a semiconductor device according to EMBODIMENT 6.
Figure 16B:
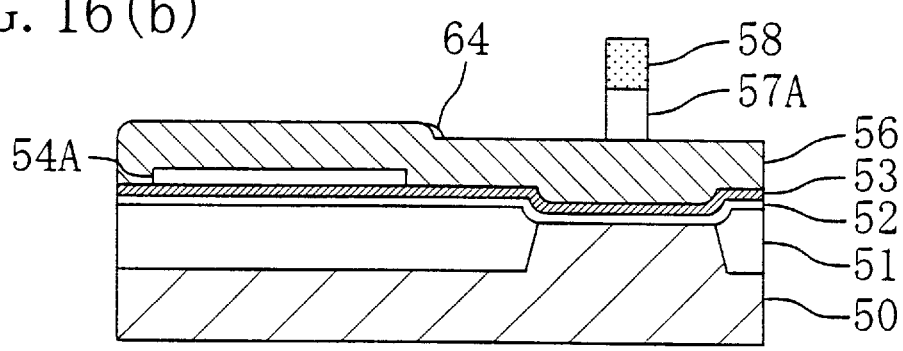
Figure 16C:
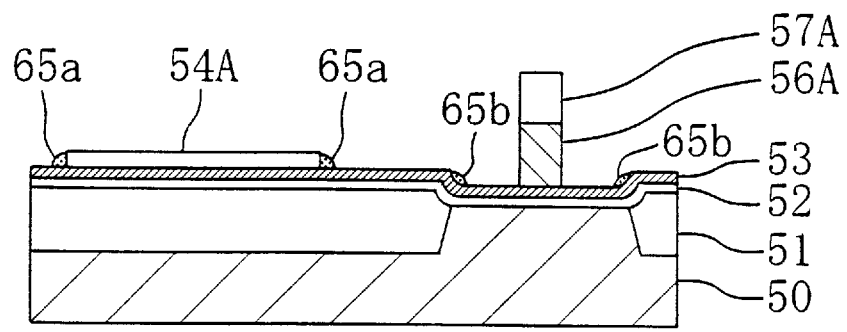

Next, the titanium nitride film 53 and the silicon oxynitride film 52 are patterned by using the first and second hard masks 54A and 57A, whereby a lower-layer gate electrode 53A and a resistor 53B each composed of the titanium nitride film 53 are formed and a gate insulating film 52A and a patterned insulating film 52B each composed of the silicon oxynitride film 52 are formed, as shown in FIG. 15(a).

Figure 15B:
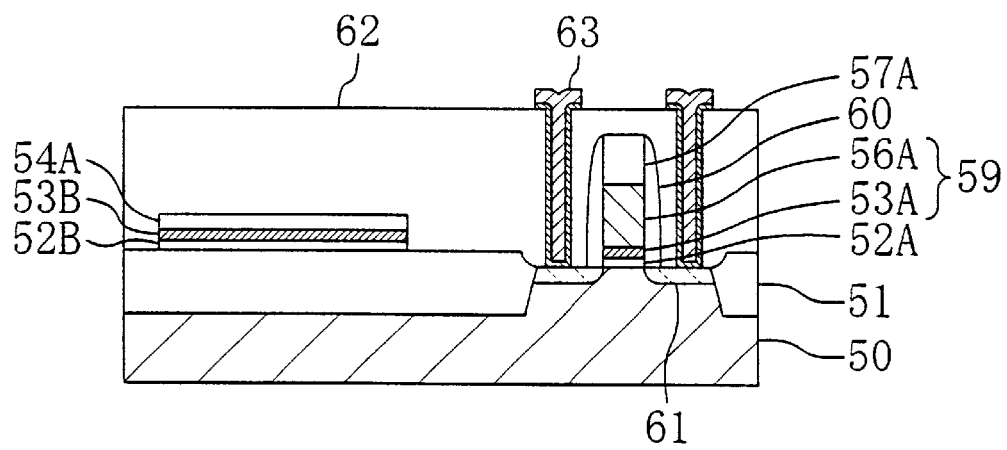

Next, as shown in FIG. 15(b), sidewalls 60 are formed by a well-known method on the side surfaces of a gate electrode 59 composed of the upper-layer gate electrode 56A and the lower-layer gate electrode 53A and impurity diffused layers 61 each serving as a source or drain are formed in the semiconductor substrate 50.

Next, an interlayer insulating film 62 is formed entirely over the gate electrode 59 and the resistor 53B and then contact holes are formed in the interlayer insulating film 62. Subsequently, a metal film is deposited on the interlayer insulating film 62 to fill in the contact hole and patterned to form contacts and metal wiring 63.

Thus, since the resistor 53B has been formed by patterning the titanium nitride film 53 serving as the lower-layer gate electrode 53A according to EMBODIMENT 6, the effect of forming the resistor 53B without increasing the number of process steps is achieved in addition to the effects achieved by EMBODIMENT 1.

Although the titanium nitride film 53 serving as the resistor 53B is a conductive material, it has a high resistivity of 150 to 250 $\mu\Omega\cdot cm$ and a small thickness of 10 to 20 nm so that a sufficiently high sheet resistance value of about 200 $\Omega/\square$ is achievable.

Since the resistor 53B is composed of the titanium nitride film 53, variations in the characteristics of the resistor and the degradation of RF characteristics as caused by a heat treatment during the fabrication process in a resistor composed of a polysilicon film doped with a conductive impurity do not occur. In other words, EMBODIMENT 6 not only reduces the number of process steps but also improves the characteristics of the resistor 53B.

What is claimed is:

1. A method for fabricating a semiconductor device, the method comprising the steps of:

forming a first insulating film serving as a gate insulating film on a semiconductor substrate;

depositing a titanium nitride film by chemical vapor deposition on the first insulating film;

forming a second insulating film on the titanium nitride film and patterning the second insulating film to form a capacitor insulating film;

depositing a tungsten film by sputtering on the titanium nitride film; and patterning a multilayer film comprising the tungsten film and the titanium nitride film to form a gate electrode composed of the multilayer film, wherein the step of patterning the multilayer film to form the gate electrode includes the step of:

forming an upper electrode of a capacitor composed of the tungsten film and a lower electrode of the capacitor composed of the titanium nitride film.

2. A method for fabricating a semiconductor device, the method comprising the steps of:

forming a first insulating film serving as a gate insulating film on a semiconductor substrate;

depositing a titanium nitride film by chemical vapor deposition on the first insulating film;

forming a second insulating film on the titanium nitride film and patterning the second insulating film to form a hard mask composed of the second insulating film above the isolation region;

depositing a tungsten film by sputtering on the titanium nitride film; and patterning a multilayer film comprising the tungsten film and the titanium nitride film to form a gate electrode composed of the multilayer film, wherein the step of patterning the multilayer film to form the gate electrode includes the step of:

patterning the titanium nitride film by using the hard mask to form a resistor composed of the titanium nitride film.

3. The method for claim 2, wherein a thickness of the second insulating film is approximately equal to or less than a height of a portion of the isolation region protruding from the semiconductor substrate.

4. A method for fabricating a semiconductor device, the method comprising the steps of:

forming a first insulating film serving as a gate insulating film on a semiconductor substrate;

depositing a titanium nitride film by chemical vapor deposition on the first insulating film;

depositing a tungsten film that does not include a halogen element by sputtering on the titanium nitride film; and patterning a multilayer film comprising the tungsten film and the titanium nitride to form a gate electrode composed of the multilayer film, wherein the step of depositing the titanium nitride film includes a step of performing a heat treatment with respect to the titanium nitride film in an ammonia atmosphere, while residual impurities contained in the titanium nitride film are reduced by the heat treatment.

5. The method of claim 4, wherein the step of performing the heat treatment with respect to the titanium nitride film is performed in a chamber in which the titanium nitride film as been deposited.

6. The method of claim 4, wherein the halogen element is fluorine.

7. The method of claim 4, wherein the impurities are chlorine, iodine or bromine.

8. A method for fabricating a semiconductor device, the method comprising the steps of:

forming a first insulating. film serving as a gate insulating film on a semiconductor substrate;

depositing a titanium nitride film by chemical vapor deposition on the first insulating film;

depositing a tungsten film that does not include a halogen element by sputtering on the titanium nitride film; and patterning a multilayer film comprising the tungsten film and the titanium nitride film to form a gate electrode composed of the multilayer film, wherein the step of depositing the titanium nitride film includes a step of performing a heat treatment with respect to the titanium nitride film at a temperature not less than a temperature at which the titanium nitride film is deposited, while residual impurities contained in the titanium nitride film are reduced by the heat treatment.

9. The method of claim 8, wherein the heat treatment is performed in an ammonia atmosphere.

10. The method of claim 8, wherein the halogen element is fluorine.

11. The method of claim 8, wherein the impurities are chlorine, iodine or bromine.

12. A method for fabricating a semiconductor device, the method comprising the steps of:

forming a first insulating film serving as a gate insulating film on a semiconductor substrate;

depositing a titanium nitride film by chemical vapor deposition on the first insulating film;

depositing a tungsten film that does not include a halogen element by sputtering on the titanium nitride film; and patterning a multilayer film comprising the tungsten film and the titanium nitride film to form a gate electrode composed of the multilayer film, wherein the step of depositing the titanium nitride film is performed at a temperature not less than 600° C. to reduce residual impurities contained in the titanium nitride film.

13. The method of claim 12, wherein the halogen element is fluorine.

14. The method of claim 12, wherein the impurities are chlorine, iodine or bromine.

* * * * *